United States Patent [19]

Tremmel

[11] Patent Number: 5,632,679
[45] Date of Patent: May 27, 1997

[54] TOUCH SENSITIVE COMPUTER INTERFACE CONTROLLER

[76] Inventor: Michael Tremmel, 1136 Luzerne St., Scranton, Pa. 18504

[21] Appl. No.: 351,792

[22] Filed: Dec. 8, 1994

Related U.S. Application Data

[63] Continuation-in-part of Ser. No. 966,362, Oct. 26, 1992, Pat. No. 5,409,239.

[51] Int. Cl.$^6$ .................................................. A63F 9/24
[52] U.S. Cl. ................................. 463/36; 273/148 B
[58] Field of Search .................. 463/37, 36; 273/148 B, 273/438, 434, 433; 307/116, 112; 345/156, 157, 160; 341/22, 20; 200/DIG. 2, DIG. 23; 340/524, 517

[56] References Cited

U.S. PATENT DOCUMENTS

| | | | |
|---|---|---|---|
| 3,879,618 | 4/1975 | Larson | 307/116 |
| 4,063,111 | 12/1977 | Dobler et al. | 307/116 |
| 4,105,902 | 8/1978 | Iwai et al. | |
| 5,085,119 | 2/1992 | Cole | |
| 5,291,068 | 3/1994 | Rammel et al. | 307/116 |
| 5,367,199 | 11/1994 | Lefkowitz et al. | 307/116 |

*Primary Examiner*—Mark S. Graham
*Assistant Examiner*—Michael O'Neill

[57] ABSTRACT

Disclosed is a video game controller for use with a video game computer system such as used in home, hand held, and arcade video games. The controller uses a plurality of singularly electrically conductive contact points adapted to touch the skin of the hands of the user whereby the electrical resistance of the skin of the hands and fingers of the user to the passage of electric current from one or more of the contact points will activate one or more switch circuits within the controller housing are connected to a video game computer. Also disclosed are oscillator circuitry, diagonal control circuitry, amplifier circuitry, wireless control circuitry, and memory control ciruitry that provides for special functions within the video game computer.

5 Claims, 7 Drawing Sheets

TOUCH SENSITIVE COMPUTER INTERFACE CONTROLLER

RELATED U.S. PATENT APPLICATION

This patent application is a continuation in part of the Touch Sensitive Video Game Controller application, Ser. No. 07/966,362, Oct. 26, 1992 filing date, and which is now U.S. Pat. No. 5,409,239.

BACKGROUND OF THE INVENTION

1. Field of the Invention

This invention pertains to a controller for human interaction in video games with any computer video game machine system including video game usage on personal computers and hand held video games as well.

2. Description of the Prior Art

The controller for the Nintendo Entertainment System is cited under U.S. Pat. No. 4,687,200. This controller is one example of the features present in most prior art video game controller inventions. The hard plastic button projections have rough hard edges that can cause injury to the skin due to collision during video game playing. The downward pressure in conjunction with the skin collision causes blisters and physically stresses the tendons and muscles of the hand. Another disadvantage to the controller is that the buttons are not engaged until they are displaced a distance inward. The reaction time to depress a button is small but with current fasted paced video games a reduction in the time of switch engagement can result in the difference of winning instead of losing a video game.

The U.S. Pat. No. 5,207,426 is a controller for the Super Nintendo Entertainment System. This patented invention is a slight improvement on the old version of the Nintendo controller. The design of the controller reduces the harshness of the touchable surfaces by rounding edges and using softer materials for the button projections. This design only diminishes the blistering effect on the skin. The stress on the tendons and muscles of the hands has not been decreased by this design because the buttons still require pressure to be engaged. The buttons for the Super Nintendo controller must be depressed inward which reduces the player's reaction time. Occasionally with this type of controller design, the buttons are not depressed hard enough or the switch contacts are worn which prevents engagement of the switches; as a result this can cause the end of the game and give frustration to the player.

The Human-Machine Interface Apparatus invention of U.S. Pat. No. 4,071,691 is an invention that primarily delivers a touch sensitive device that by intent can only be used to provide x and y axis information. The information is an analog form of processing which has to be precisely calibrated and converted to digital form to be used with computers. The "mouse", "light pen" or "touch screen" of current technology for personal computers do the same function with little or no bulky device in the way.

The objective of the Video Game Apparatus and Method invention of U.S. Pat. No. 4,302,011 is to eliminate projecting knobs and buttons by transferring them all to one uniformly smooth surface which prevents injury from collision with knobs or levers. The intent of this invention is to allow two-axis motions without the use of two separate knobs or levers. The objective is for a good reason but the method is flawed when it comes to video games of current fast paced nature. The reason for this is when interacting with a video game the eyes can not leave the screen to look for different access points on a flat surface, even for a moment, or precious seconds could be lost. The information output is a simple two dimensional co-ordinate which is a great limitation because the complex video games of today need more input information from the user on a multi-function level.

The patented invention under U.S. Pat. No. 3,737,670 entitled Touch Sensitive Electronic Switch is designed with two electrodes in close proximity with each other. Two separate electrodes are required for each button. The design is such that pressure, although slight, is required to engage the switch, thereby defeating the touch sensitivity. The invention discloses electrically conductive gloves or an electrically conductive cover for certain applications of the invention; nevertheless, these disclosures again defeat the purpose of the touch sensitive invention. The patented material does not specifically state the possibility for it to be used for video game systems. The invention does disclose an amplifier in order to produce the touch sensitivity feature but only when both electrodes on a single switch are bridged by the skin of a finger.

One objective of the game controller of this invention is to eliminate the pushing down of buttons by using touch sensitive circuitry. Another objective of this new invention is to keep the electrical conductive contact points as smooth and/or soft as possible. The invention reduces stress on the tendons and muscles of the hands including skin blisters and increases reaction time. A plurality of singularly electrically conductive touch sensitive contact points project out of the controller so that the player can distinguish between the various buttons with the sense of touch. Different variations of the embodiment can be combined to produce basic touch sensitive controllers, controllers with diagonal contact points for ease of directional control, controllers with oscillators that can be adjusted and are engaged with one touch sensitive contact point for rapid fire, controllers that can be wireless, controllers that can store a combination of moves in memory, and controllers that contain amplifier circuitry to enhance the existing touch sensitivity by decreasing the need of bridging two conducting points to only touching one singularly electrical contact point. The design is a combination of circuits joined in this manner to create a new video game controller. The appearance of the invention has rounded edges, smooth buttons, and is small enough to fit comfortably within the palms of the two hands.

BRIEF SUMMARY OF THE INVENTION

The video game controller is a modified version of most prior art controllers. The main modification that sets this invention apart from any other controller is the touch sensitive circuitry, and diagonal control circuitry that is added with prior art digital computer interface circuitry. The resulting combination is a new and more effective controller for video game playing. This invention includes touch sensitive circuitry, diagonal control circuitry, oscillator and oscillator control circuitry, amplifier circuits, memory circuits, and circuitry providing cordless operation of the invention as variations on the preferred embodiment. All of these circuitries can be combined to form one controller. The invention is such that the computer interface circuitry, and number of conductor contact points can be changed to use the new invention with almost any commercial, home, or hand held computer video game system.

The invention improves reaction time during video game playing. This reduction in reaction time adds excitement to the game for the player or players. It also reduces the stress on the hands and skin of the player. The electrically conductive material used for the contact points can be metal or a soft material.

DESCRIPTION OF THE PREFERRED EMBODIMENTS

Figure 1:
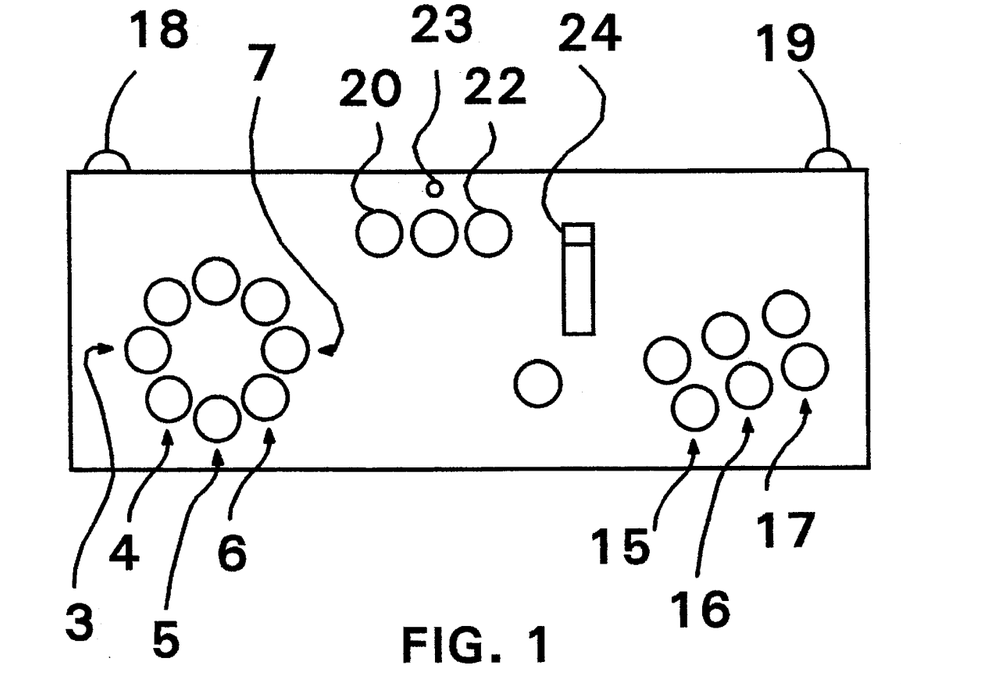
FIG. 1 is a top view in accordance with the preferred embodiment of the invention, showing the conductor contact points and their relative positions.
Figure 2:
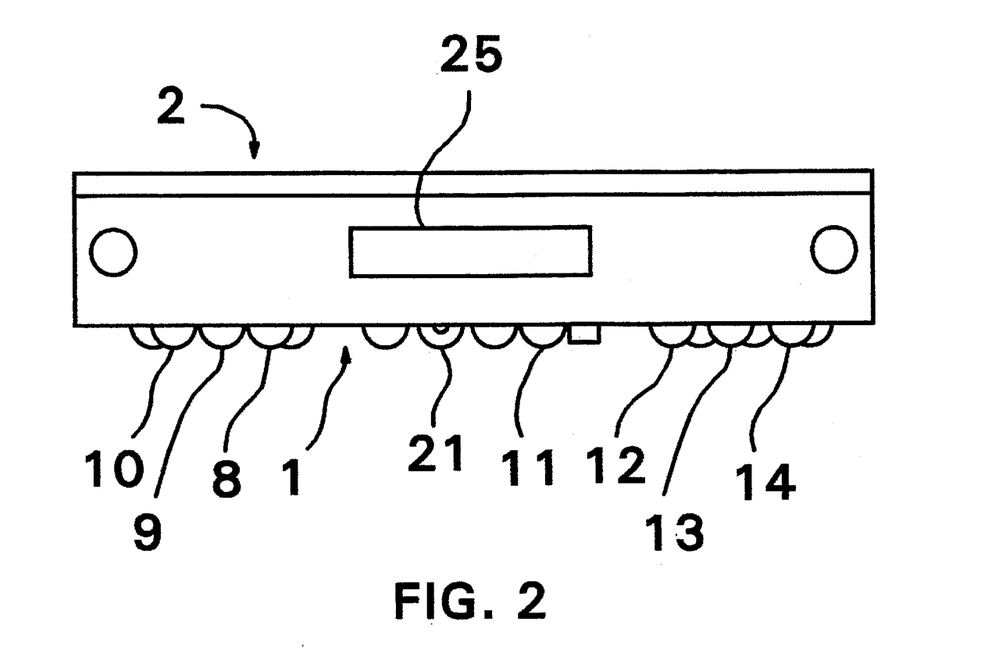
FIG. 2 is the back view of the embodiment of FIG. 1, showing the various parts and the smoothness of the contact points.

FIGS. 1 and 2 are views of the appearance of the touch sensitive controller in accordance with the preferred embodiment of the invention. FIG. 1 is the top view of the touch sensitive controller. FIG. 2 is the back view of the touch sensitive controller.

Referring to FIGS. 1 and 2, the outside casing 1 is a durable non-conductive material that contains, insulates, and protects the inner circuits. The dimensions of the outside casing 1 are to be within reasonable size to accommodate all the needed contact points 3 through 22 including the oscillator frequency control 24 and fit comfortably in the palms of both hands. In one embodiment of the invention shown as FIG. 5 the main contact point 2 must be in contact with the skin of the palms for any of the contact points 3 through 18 to complete the switching in the touch sensitive circuitry 30 in FIG. 5. When the skin and finger 29 in FIG. 5 bridges one or more of the contact points 3 through 18 to the main contact point 2 those touch sensitive switch circuits are engaged. The contact points 3 through 10 in FIGS. 1 and 2 control the direction of a character on the video game screen. The character is any video displayed object on the game screen. Contact point 3 moves the character left on the screen, and the other direction controls are as follows; 4 (left-downward diagonal direction), 5 (down), 6 (right-downward diagonal direction), 7 (right), 8 (right-upward diagonal direction), 9 (up), and 10 (left-upward diagonal direction). Contact point 11 is the start button which initiates the video game from the beginning. The contact point 19 is a touch sensitive button which activates the oscillator or "rapid" control for use with one of the action buttons 12 through 17. Contact points 12 through 18 are action buttons which depend upon the certain video game cartridge installed in the computer system. The contact points 20, 21, and 22 are for activation and programming of the memory control circuitry 77 in FIG. 9. Contact point 20 is to activate the memory circuits and the light emitting diode 23 lights when the memory circuits are activated. Contact point 21 is to be engaged while the memory is being programmed by the user. Contact point 22 is touched simultaneously with the button that is to execute the moves stored in memory with the single touch of that chosen button. In advanced video games some game aspects require several moves in the appropriate order for a single action to take place. The ability to program the moves in memory and transfer that function to one button on the controller improves the video game playing speed of the user. The specific functions of the contact points 3 through 18 can vary depending on the video game or a level change in the game. The signal emitting component 25 is part of the signal emitter circuitry 73 in FIG. 8 and can be either some type of light emitter, antenna or other such component depending on what form of cordless medium is chosen for a particular embodiment of this invention.

Figure 3:
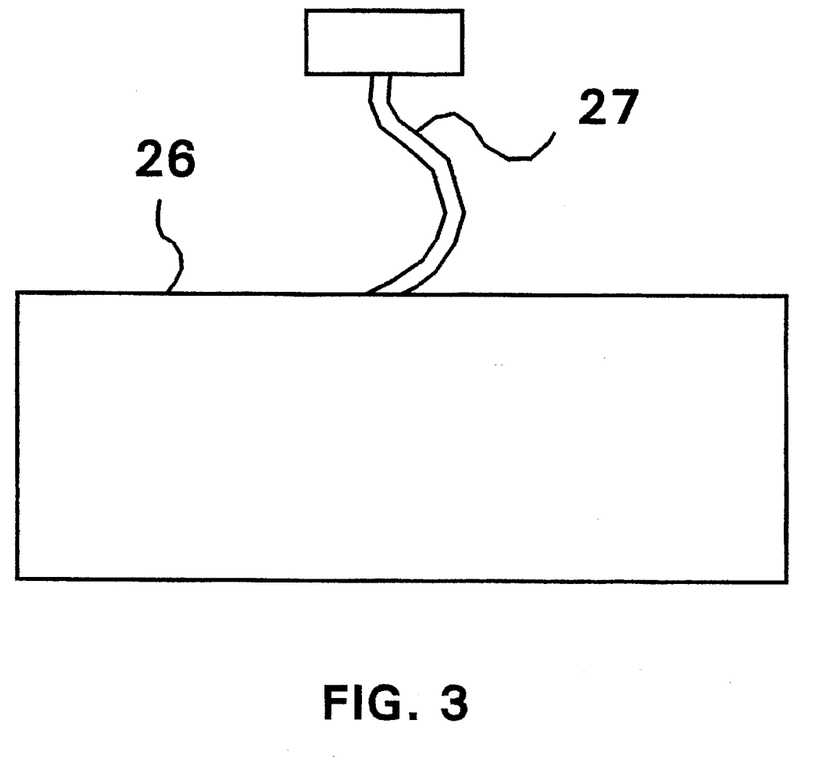
FIG. 3 is the top view of the signal detecting device of the cordless touch sensitive video game controller embodiment.
Figure 4:
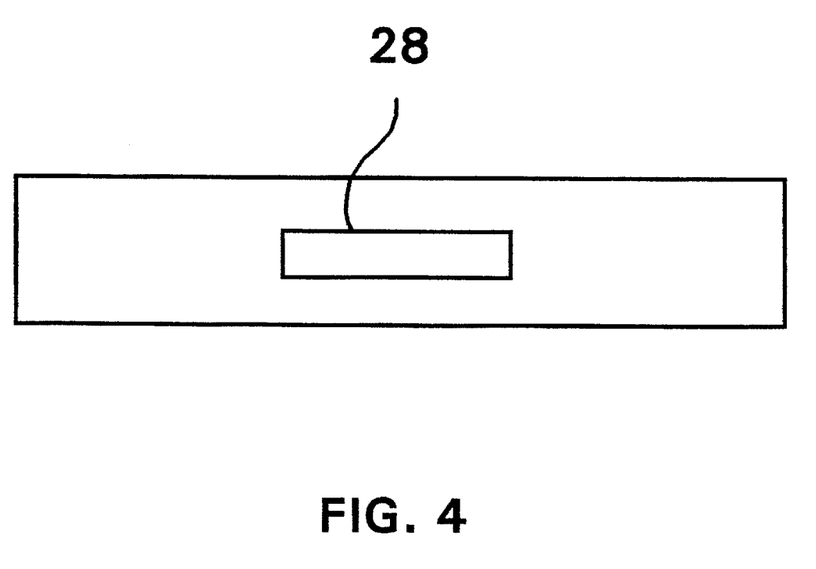
FIG. 4 is the front view of the signal detector device of the cordless touch sensitive video game controller embodiment.

FIGS. 3 and 4 are views of the signal detector device of the preferred embodiment. FIG. 3 is the top view which shows the outer casing 26. The output wiring with connector 27 is required to connect the invention to a computer video game system. The front view of the detector device is shown in FIG. 4. The signal detecting component 28 has the versatility of changing to fit a particular cordless medium desired.

Figure 5:
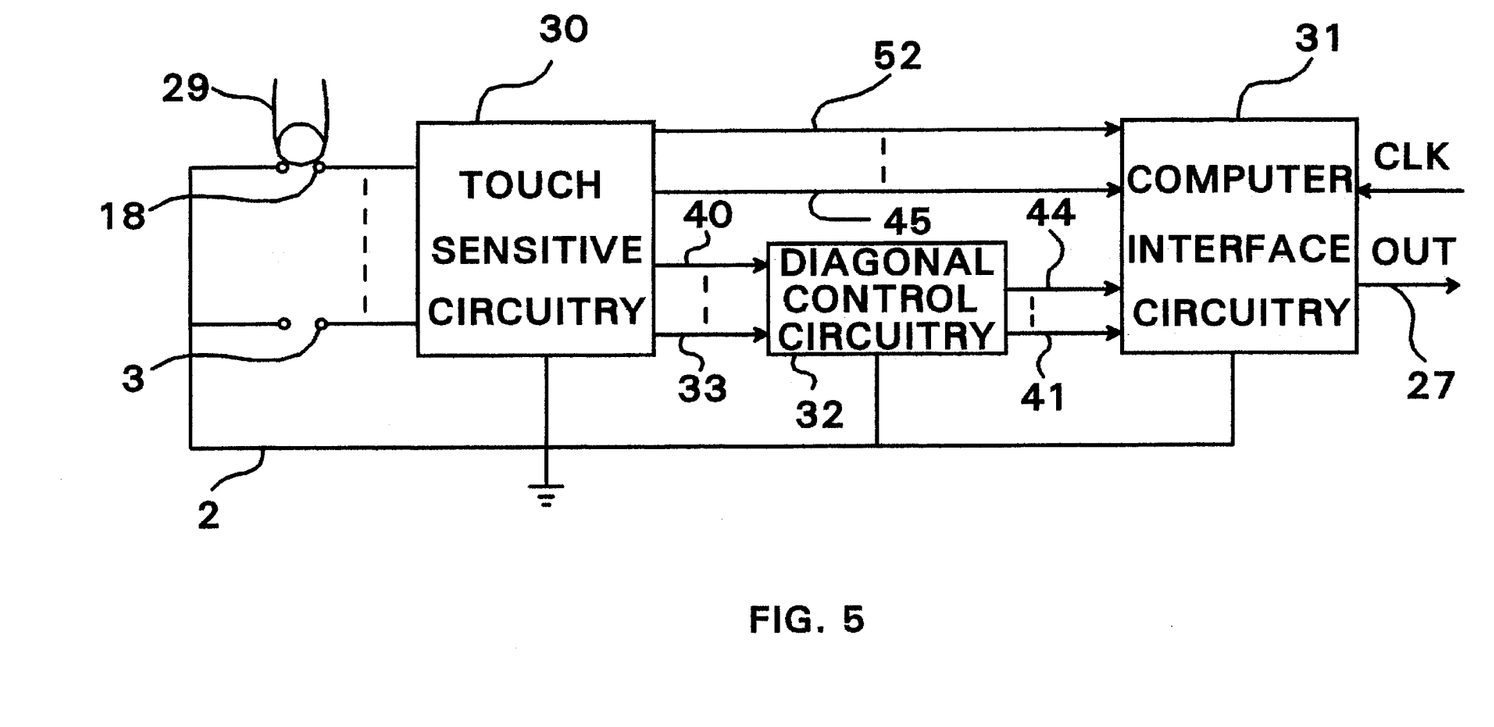
FIG. 5 is a block diagram of one embodiment of the invention illustrating the diagonal and other required electronic circuitry.

One basic embodiment of the invention is shown in FIG. 5. This design incorporates diagonal control circuitry 32. This circuitry 32 consists of basic digital logic circuitry which engages two adjacent direction control buttons with only one diagonal button engaged by the user. The directional input information on a plurality of the singularly electrically conductive contact points 3 through 10 traverses through the touch sensitivity circuitry 30 and the eight data lines 33 through 40 are outputted into the diagonal control circuitry 32. The diagonal control circuitry 32 converts the eight direction buttons to four directional output data lines 41 through 44. The converted data lines 41 through 44 are directional controls of left, down, right, and up respectfully or any combination of engagement of these Outputs. The circuitry 32 examines the diagonal input information; if one or more diagonal buttons are engaged, the circuitry 32 simultaneously outputs the information to the computer interface circuitry 31 that the two adjacent direction buttons are engaged. In addition, the circuitry 32 also outputs the status of the four individual direction buttons 3, 5, 7, and 9. Without the four diagonal buttons 4, 6, 8, 10 and the related control circuitry 32, the user of the controller would have to engage two adjacent direction buttons 3, 5, 7, or 9 manually simultaneously in order to move the character on the screen diagonally. The distance between two of the direction buttons could make it difficult for a child with small fingers to bridge the gap. Although the child may be able to accomplish the bridge between the two singularly conductive directional contact points, it would be faster and easier to engage a single contact point for any particular diagonal direction desired; thus enhancing the video game playing experience. All the other inputs not associated with the diagonal control circuitry 32 are outputted from the touch sensitive circuitry 30 by data lines 45 through 52 into the computer interface circuitry 31. The information on the data lines 41 through 52 is then passed to the computer interface circuitry 31 which converts the information further into a form the computer system can recognize and is outputted on wiring and connector 27 to the video game computer system.

Figure 6:
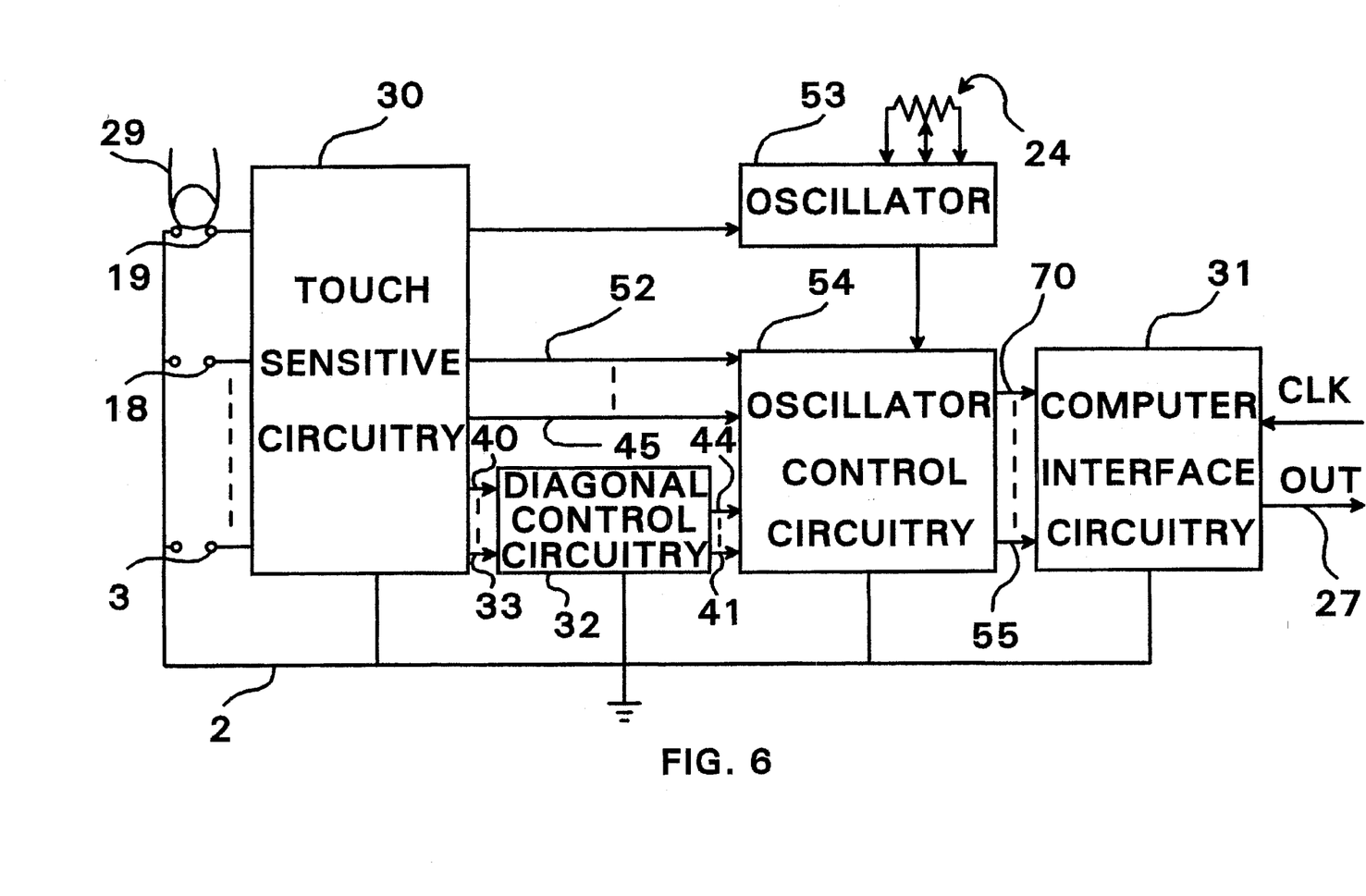
FIG. 6 is a block diagram of the added oscillator and oscillator control circuitry embodiment of the invention for continuous engagement and disengagement of one or more contact points.

FIG. 6 is an embodiment which combines the diagonal control circuitry 32 with the improved rapid engagement oscillator control circuitry 54 and the oscillator source 53. The invention of patent application Ser. No. 07/966,362, which this invention is a continuation in part, discloses a separate slide switch and oscillator source for one or more of the input buttons. On this new preferred embodiment with the old design would need at least six separate slide switches for the user to choose a rapid fire option for any action button. The time used by a player to search for a particular switch to engage the rapid option is wasteful, because the need for that option could pass in the blinking of an eye putting a slight hindrance on the video game playing. The touch sensitive singular contact point 19 when bridged to the main conductor contact point 2 through the skin of the hand engages a single oscillator 53. While the oscillator 53 is engaged, if any other one or more of the singular contact points are engaged, the output to the computer interface circuitry 31 is a rapid pulsing of engagement and disengagement of those particular contact points. The rapid fire option for every switch connected to the oscillator control circuitry 54 can then be disengaged quickly and easily with a single finger by lifting it off the contact point 19. The oscillator control circuitry 54 is logic circuitry that can be connected to one or more inputs to provide a rapid operation of those buttons through a single control button 19. The main oscillator source 53 is equipped with a variable rheostat control 24 which allows the user to alter the frequency of the rapid fire to provide an extra feature which may be useful in some type of video games. The incoming information to the computer interface circuitry 31 from data lines 55 through 70 is then converted further into a form the computer system can recognize and is outputted on wiring and connector 27 to the video game computer system.

Figure 7:
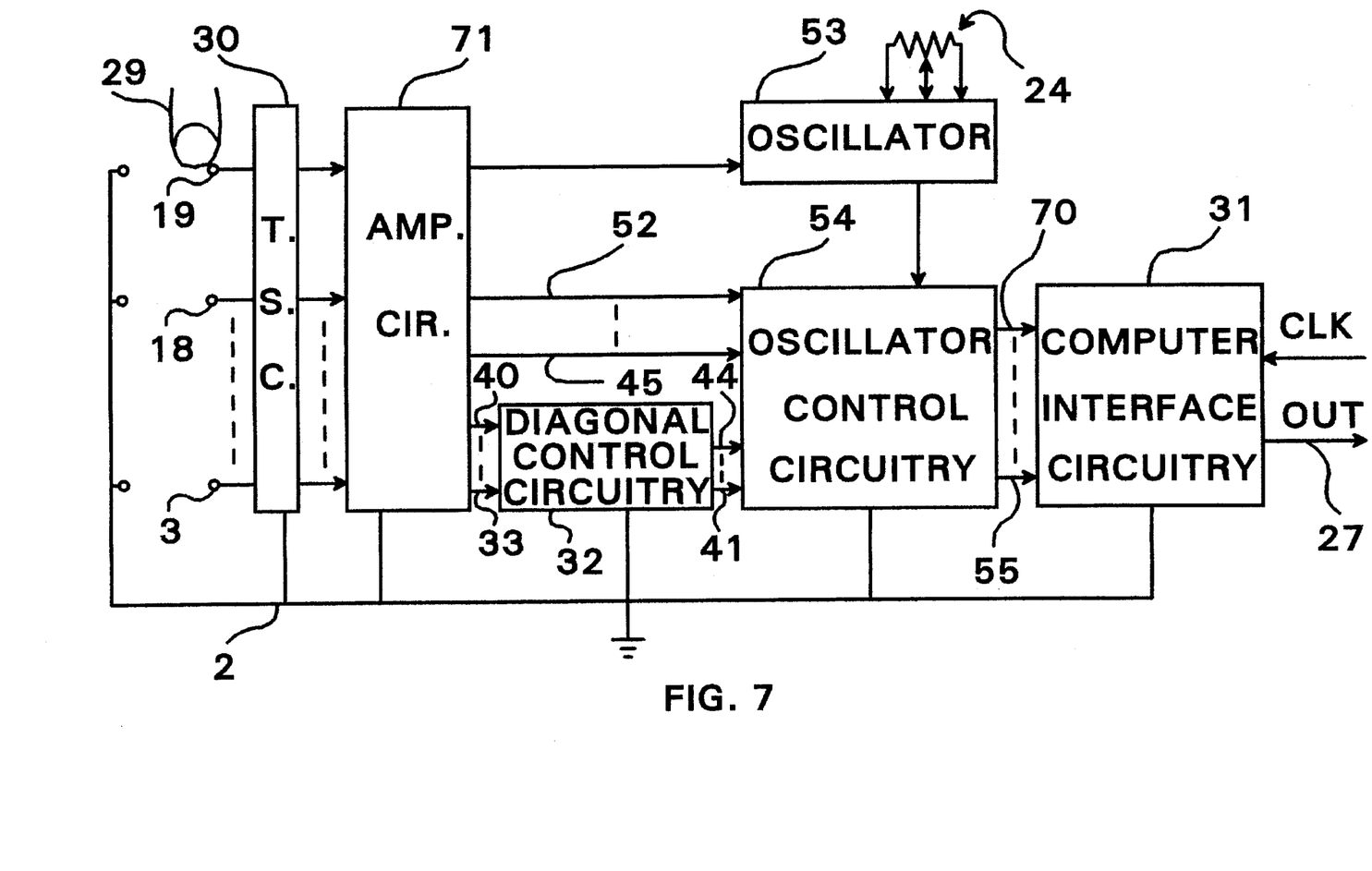
FIG. 7 is a block diagram of the added amplifier circuitry embodiment of the invention for a single touch switch engagement of a singularly conductive contact point.

Another modified embodiment of this controller invention is displayed in FIG. 7. This embodiment adds amplifier circuitry 71 directly after the touch sensitive circuitry 30. This amplifier circuitry 71 is to enhance the already present touch sensitive ability of the invention. The enhancement results in the increased sensitivity of the singularly electrically conductive contact points 3 through 19 in FIG. 7. The improved sensitivity allows the contact points 3 through 19 to be engaged without being bridged to the main contact point 2 through the skin by the single touch of a finger. This improvement will eliminate the chance of the user's skin whereas briefly by normal hand movement may not be in full contact with the main contact point which may result in not engaging a contact point that is touched. The information inputted to the computer interface circuitry 31 from data lines 55 through 70 is then converted further into a form the computer system can recognize and is outputted on wiring and connector 27 to the video game computer system.

Figure 8:
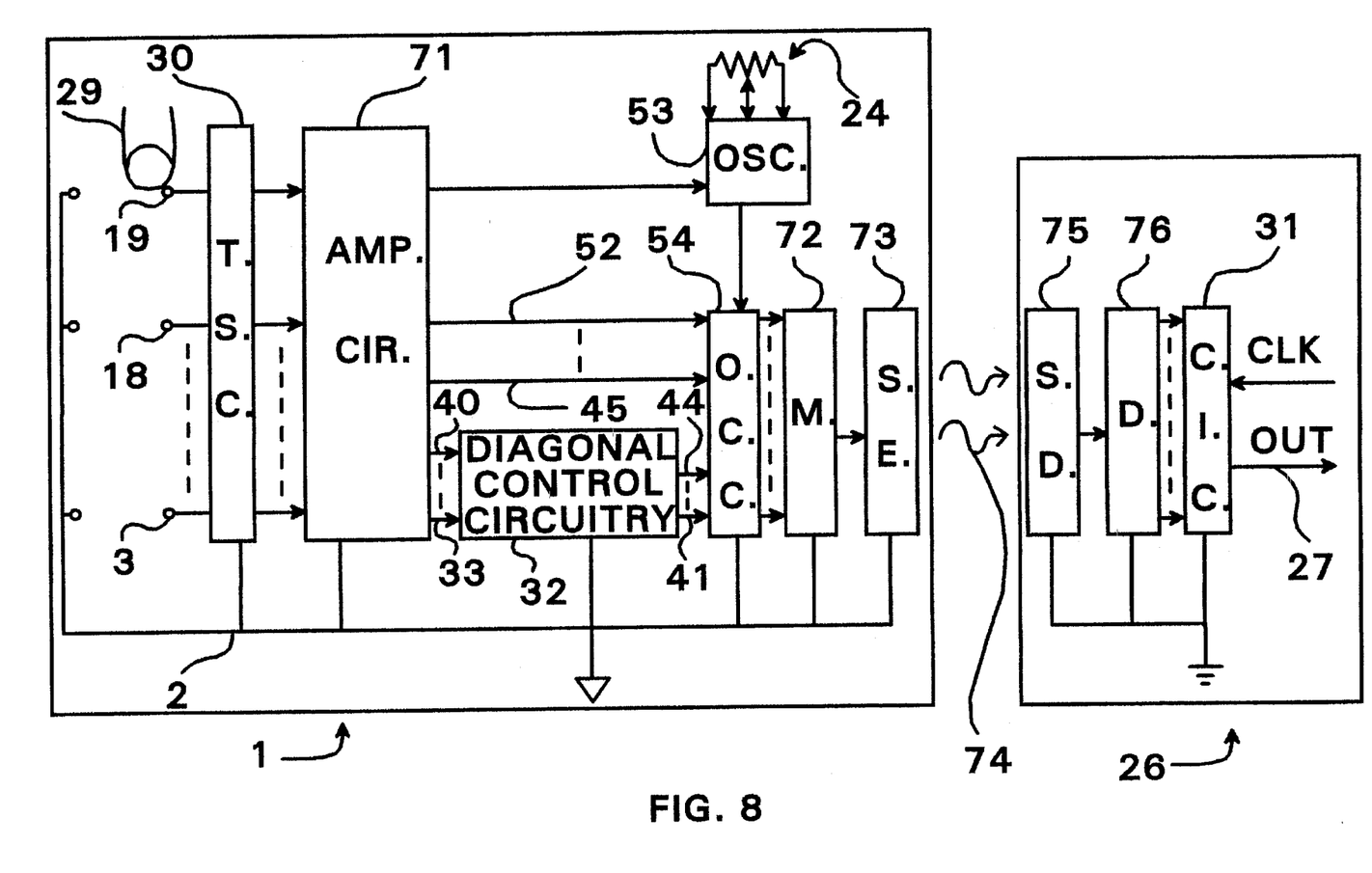
FIG. 8 is a block diagram of the added cordless circuitry as another embodiment of the invention.

FIG. 8 is the block diagram of another embodiment of the invention. The connections 55 through 70 in FIG. 7 between the oscillator control circuitry 54 and the computer interface circuitry 31 are disconnected for the additional circuitry needed. The signals coming from the oscillator control circuitry 54 are reduced from sixteen data lines to one data line by the multiplexing circuitry 72 in FIG. 8. This single output is then converted by the signal emitter circuitry 73 to a signal 74 and emitted through space. The signal detector circuitry 75 is such that it recognizes the signal 74 and transposes the information into a single electrical output which is connected to the demultiplexing circuitry 76. The demultiplexing circuitry 76 converts this information from the signal detector 75 back into the original sixteen data lines of information. The information on the data lines is then connected to the computer interface circuitry 31 which converts the information further into a form the computer system can recognize and is outputted on wiring and connector 27 to the video game computer system. This embodiment is without the tangled wire to trip over or to put a limit on the distance a controller is from the video game system.

Figure 9:
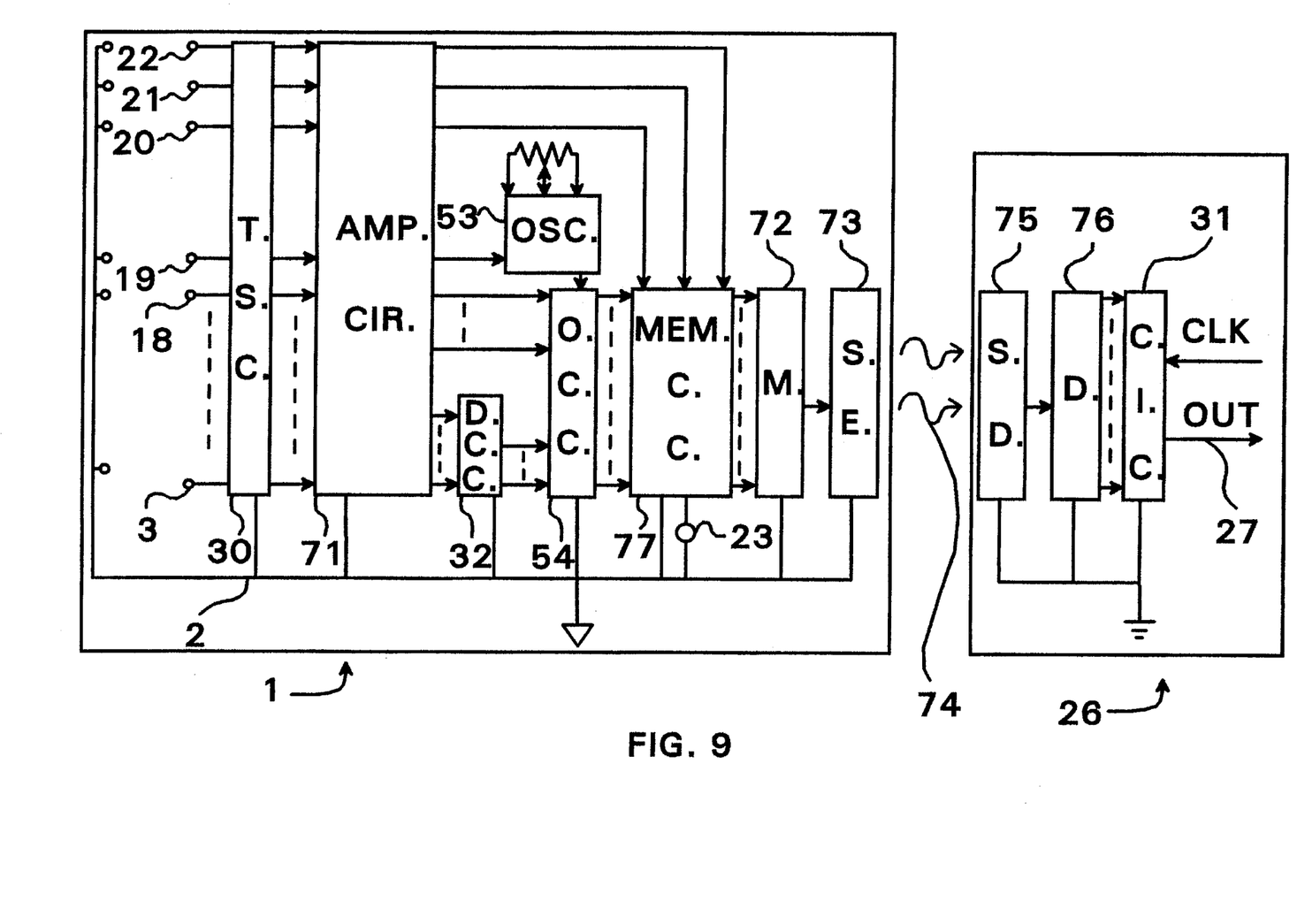
FIG. 9 is a block diagram of the preferred embodiment of the invention with the memory circuits added showing all variations of the embodiments combined.

FIG. 9 is a block diagram of the preferred embodiment of this invention with all variations including memory control circuits 77 added. The function of the memory circuits 77 is to store a successive combination of moves which perform a single action. The stored movements can then executed by the touch of one of the contact points 12 through 17 chosen by the user. The memory circuits 77 are activated by a single touch to contact point 20 and can be deactivated by a second touch to contact point 20. The light 23 shows the status of the memory circuits by lighting for circuit activation. The combination of moves are stored by the use of contact point 21. The contact point of choice is stored in memory by touching it along with contact point 22 simultaneously.

What I claim is:

1. A touch sensitive video game controller to be held between the hands of the user, said controller comprising:

an electrically non-conductive top housing and a singularly electrically conductive bottom housing which combine to form an outer housing for said controller, said housing containing touch sensitive circuitry, diagonal control circuitry and interface means;

said top housing having a plurality of singularly electrically conductive first contact points, each first contact point being mounted below said top housing, extending through an aperture in said top housing and projecting above said top housing;

said bottom housing being connected to one end of a supply voltage and forming a second electrically conductive contact point, said second contact point and any one of said plurality of first contact points being bridged by the skin of the user by the holding of said controller and simultaneous touching of any one of said first contact points thereby activating touch sensitive circuitry;

said touch sensitive circuitry comprising a plurality of touch sensitive circuits, each said touch sensitive circuit comprising three resistors arranged in series, with each end of said series being respectively connected to a positive and a negative terminal of the said supply voltage, wherein one of said resistors includes the electrical skin resistance of a user, whereby the electrical resistance of the skin to the passage of electrical current forms a part of said touch sensitive circuit and the simultaneous touching of any of said first contact points and said second contact point completes said circuit;

said diagonal control circuitry comprising a plurality of digital logic switching circuits, each circuit comprising of several digital logic gates monitoring one of the said first contact points which control diagonal direction including the two adjacent direction control inputs of the said first contact points through the said touch sensitive circuits, whereby the engagement of said diagonal first contact point results in the simultaneous engagement of the said two adjacent first contact points with a single touch, wherein the engagement of one of the two said single adjacent first contact points results in only the engagement of that single contact point and activates said interface means;

and said interface means including means for outputting a signal representative of said touch, said signal being in a form recognizable as a controller input for use with at least one of a video game computer system and a personal computer system running a video game.

2. The video game controller of claim 1, further comprising amplifier means connected between said touch sensitive circuits, said diagonal control circuits and said interface means, said amplifier means for increasing the sensitivity of said touch sensitive circuits, whereby the skin of the finger without bridging the skin to the said second contact point touching one or more of the said first contact points results in activation of said touch sensitive circuits, said diagonal control circuits, and said interface means.

3. The video game controller of claim 1, further comprising cordless means connected between said touch sensitive circuits, or said amplifier means including diagonal control circuits, and said interface means, said cordless means comprising multiplexing circuits, whereby converting all plurality of data flow from said first contact points into a single data flow connected to signal emitting circuits for emitting said single data flow through space and into signal receiving circuits for outputting said single data flow into demultiplexing circuits converting said single data flow into said all plurality of data flow.

4. The video game controller of claim 1, further comprising oscillator and oscillator control means connected between one or more of said touch sensitive circuits and said interface means, said oscillator means for outputting a rapid repetitive digital signal to said interface means upon activation of said touch sensitive circuit or circuits, such that a user's single touch results in a plurality of rapid repetitive output signals from one or more of the touch sensitive circuits to said interface means, and said oscillator control means activated by a single touch sensitive circuit whereby the touch sensitive circuits connected to the oscillator circuits output a rapid repetitive signal to said interface means when one or more are bridged by the skin of the user, said oscillator control circuits further comprising a variable rheostat control in which the user can vary the rate of the said rapid repetitive signal with respect to time.

5. The video game controller of claim 1, further comprising memory storage means comprising random access memory, and logic gating circuits connected between said oscillator control circuits and said interfacing means, whereby the storage of a succession of moves previously inputted by the user and the activation of said memory storage means resulting in the execution of said storage of moves wherein the single touch of a predetermined contact point determined by user is means of activation of said memory circuits.

* * * * *